(12) United States Patent
Okada et al.

(10) Patent No.: US 10,998,627 B2
(45) Date of Patent: May 4, 2021

(54) PHASE ADJUSTMENT CIRCUIT AND ARRAY ANTENNA DEVICE

(71) Applicants: NEC CORPORATION, Tokyo (JP); TOKYO INSTITUTE OF TECHNOLOGY, Tokyo (JP)

(72) Inventors: Kenichi Okada, Tokyo (JP); Keiichi Motoi, Tokyo (JP); Naoki Oshima, Tokyo (JP); Rui Wu, Tokyo (JP); Jian Pang, Tokyo (JP)

(73) Assignees: NEC CORPORATION, Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 16/757,949

(22) PCT Filed: Oct. 23, 2018

(86) PCT No.: PCT/JP2018/039261
§ 371 (c)(1),
(2) Date: Apr. 21, 2020

(87) PCT Pub. No.: WO2019/082866
PCT Pub. Date: May 2, 2019

(65) Prior Publication Data
US 2020/0266538 A1    Aug. 20, 2020

(30) Foreign Application Priority Data

Oct. 23, 2017  (JP) ............................. JP2017-204655

(51) Int. Cl.
*H04M 1/00*    (2006.01)
*H01Q 3/36*    (2006.01)
(Continued)

(52) U.S. Cl.
CPC ................. *H01Q 3/36* (2013.01); *H01Q 3/28* (2013.01); *H01Q 21/22* (2013.01); *H04B 7/0617* (2013.01); *H04L 5/0007* (2013.01)

(58) Field of Classification Search
CPC . H01Q 3/36; H01Q 3/28; H01Q 21/22; H04B 7/0617; H04L 5/0007
(Continued)

(56) References Cited

U.S. PATENT DOCUMENTS 4,713,556 A * 12/1987 Yamamoto ............... H03D 7/12
327/105
6,115,419 A *  9/2000 Meehan ............ H04L 25/03057
375/233

(Continued)

FOREIGN PATENT DOCUMENTS

JP    2017-183881 A    10/2017
WO    2009/101993 A1    8/2009
WO    2011/121979 A1    10/2011

OTHER PUBLICATIONS

Yahya Tousi et al., "A Ka-band Digitally-Controlled Phase Shifter with sub-degree Phase Precision", IEEE Radio Frequency Integrated Circuits Symposium, RTU2C-5, 2016, pp. 356-359.

(Continued)

*Primary Examiner* — Kathy W Wang-Hurst
*Assistant Examiner* — Max Mathew
(74) *Attorney, Agent, or Firm* — Sughrue Mion, PLLC (57) ABSTRACT

A phase adjustment circuit includes: a local frequency band phase shifter that adjusts a phase of a signal in a local signal frequency band and that outputs the adjusted signal; a frequency-converting mixer that receives the adjusted signal and another signal different from the adjusted signal, and that mixes the adjusted signal with the other signal; and a buffer amplifier that is provided between the local frequency band phase shifter and the frequency-converting mixer, and (Continued)

that is capable of amplifying an input power that is to be input to the frequency-converting mixer so that the input power is up to be in an input power range in which an input-output characteristic of power of the frequency-converting mixer is out of a linear region.

11 Claims, 5 Drawing Sheets

(51) Int. Cl.
  *H01Q 3/28* (2006.01)
  *H01Q 21/22* (2006.01)
  *H04B 7/06* (2006.01)
  *H04L 5/00* (2006.01)
(58) Field of Classification Search
  USPC .................................................. 455/562.1
  See application file for complete search history.

(56) References Cited

U.S. PATENT DOCUMENTS

| | | | | |
|---|---|---|---|---|
| 10,567,063 | B1* | 2/2020 | Bakeer | H04B 17/12 |
| 2003/0186669 | A1* | 10/2003 | Yamawaki | H04B 1/28 |
| | | | | 455/323 |
| 2005/0012431 | A1* | 1/2005 | Andle | G01N 29/2462 |
| | | | | 310/313 D |
| 2008/0153445 | A1* | 6/2008 | Sandner | H03G 3/3078 |
| | | | | 455/234.1 |
| 2008/0242346 | A1* | 10/2008 | Rofougaran | H04B 1/0458 |
| | | | | 455/552.1 |
| 2010/0297956 | A1* | 11/2010 | Hayashi | H03G 3/3078 |
| | | | | 455/75 |
| 2010/0323645 | A1* | 12/2010 | Kishimoto | H04L 27/362 |
| | | | | 455/127.1 |
| 2011/0051780 | A1* | 3/2011 | Kawasaki | H04L 27/365 |
| | | | | 375/135 |
| 2011/0239182 | A1* | 9/2011 | Nitta | G06F 30/30 |
| | | | | 716/135 |
| 2012/0256673 | A1* | 10/2012 | Fujibayashi | H04L 27/366 |
| | | | | 327/238 |
| 2013/0202071 | A1* | 8/2013 | Wei | H04H 40/90 |
| | | | | 375/350 |
| 2013/0247685 | A1* | 9/2013 | Smith | G01F 1/66 |
| | | | | 73/861.27 |
| 2014/0185718 | A1* | 7/2014 | Ruelke | H04N 21/42638 |
| | | | | 375/345 |
| 2014/0270018 | A1* | 9/2014 | Primo | H04L 27/3863 |
| | | | | 375/346 |
| 2015/0009064 | A1* | 1/2015 | Waldschmidt | G01S 7/4021 |
| | | | | 342/175 |
| 2015/0156823 | A1* | 6/2015 | Okajima | H05B 6/686 |
| | | | | 219/660 |
| 2015/0256787 | A1* | 9/2015 | Itagaki | H04N 5/44 |
| | | | | 348/731 |
| 2016/0161562 | A1* | 6/2016 | Stulrajter | G01R 27/08 |
| | | | | 324/650 |
| 2017/0153280 | A1* | 6/2017 | Mikulka | G01R 35/00 |
| 2018/0372530 | A1* | 12/2018 | Welle | H01Q 1/225 |
| 2019/0372190 | A1* | 12/2019 | Kord | H03H 7/1775 |

OTHER PUBLICATIONS

International Search Report for PCT/JP2018/039261 dated, Jan. 8, 2019 (PCT/ISA/210).

* cited by examiner

PHASE ADJUSTMENT CIRCUIT AND ARRAY ANTENNA DEVICE

CROSS REFERENCE TO RELATED APPLICATIONS

This application is a National Stage of International Application No. PCT/JP2018/039261 filed Oct. 23, 2018, claiming priority based on Japanese Patent Application No. 2017-204655, filed Oct. 23, 2017.

TECHNICAL FIELD

The present invention relates to a phase adjustment circuit and an array antenna device.

BACKGROUND ART

With the sudden increase in mobile traffic in recent years, there is a desire for higher precision of beam control in array antenna devices on which many antenna elements are mounted, in order to realize millimeter-band communication with strong directionality for the purpose of high-capacity communication. In order to realize such high-precision beam control, it is important to adjust, with high precision, the amplitudes and phases of signals transmitted from the respective antenna elements.

Patent Document 1 describes technology of adjusting the phase differences between local signals.

PRIOR ART DOCUMENTS

Patent Documents

[Patent Document 1]
PCT International Publication No. WO 2011/121979

SUMMARY OF THE INVENTION

Problem to be Solved by the Invention

There is also a demand for a technology that can adjust, with high precision, the amplitudes and phases of signals transmitted from antenna elements, in array antenna devices in which the phase differences in the respective antenna elements are adjusted by using phase shifters.

One example object of the present invention is to offer a phase adjustment circuit and an array antenna device that can solve the above-mentioned problems.

Means for Solving the Problem

In order to achieve the above-mentioned problem, according to one example aspect of the present invention, a phase adjustment circuit includes: a local frequency band phase shifter that adjusts a phase of a signal in a local signal frequency band and that outputs the adjusted signal; a frequency-converting mixer that receives the adjusted signal and another signal different from the adjusted signal, and that mixes the adjusted signal with the other signal; and a buffer amplifier that is provided between the local frequency band phase shifter and the frequency-converting mixer, and that is capable of amplifying an input power that is to be input to the frequency-converting mixer so that the input power is up to be in an input power range in which an input-output characteristic of power of the frequency-converting mixer is out of a linear region.

According to another example aspect of the present invention, an array antenna device includes phase adjustment circuits according to the above example aspect, and antennas that transmit an output power that is output from the phase adjustment circuits.

Effect of the Invention

According to the present invention, it is possible to adjust, with high precision, the amplitudes and phases of signals transmitted from antenna elements, also in array antenna devices in which the phase differences between the respective antenna elements using a phase shifter are adjusted.

EXAMPLE EMBODIMENTS FOR CARRYING OUT THE INVENTION

Example Embodiments

Hereinafter, example embodiments will be explained in detail by referring to the drawings.

An array antenna device 1 according to an example embodiment of the present invention is a device in which the amplitude deviation and the phase deviation in the array antenna device 1, including the amplitude deviation and the phase deviation in an amplitude adjustment block provided in each antenna element, and the amplitude deviation and the phase deviation in a phase adjustment block provided in each antenna element, can be adjusted with high precision.

Figure 1:
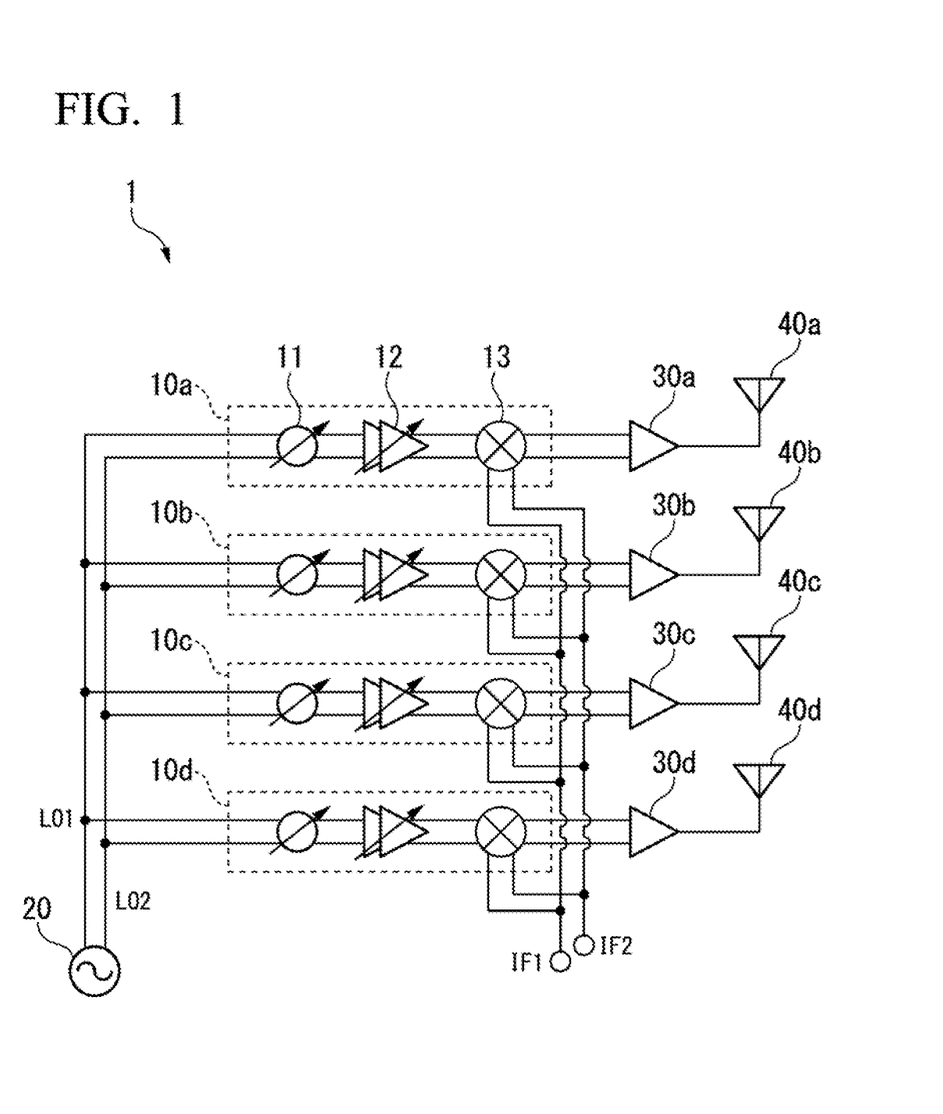
FIG. 1 is a diagram illustrating the structure of an array antenna device according to an example embodiment of the present invention.

The array antenna device 1 according to the example embodiment of the present invention, as illustrated in FIG. 1, includes phase adjustment circuits 10a, 10b, 10c and 10d, a local signal generation circuit 20, power amplifiers 30a, 30b, 30c and 30d, and transmission antennas 40a, 40b, 40c and 40d.

Hereinafter, the phase adjustment circuits 10a, 10b, 10c and 10d will be collectively referred to as phase adjustment circuits 10. The power amplifiers 30a, 30b, 30c and 30d will be collectively referred to as power amplifiers 30. The transmission antennas 40a, 40b, 40c and 40d will be collectively referred to as transmission antennas 40.

Each of the phase adjustment circuits 10 includes a local frequency band phase shifter 11, a buffer amplifier 12 and a frequency-converting mixer 13, as illustrated in FIG. 1.

The local frequency band phase shifters 11 include a ground terminal, a first input terminal, a second input terminal, a first output terminal and a second output terminal. The buffer amplifiers 12 include a ground terminal, a first input terminal, a second input terminal, a first output terminal, a second output terminal, a first IF terminal and a second IF terminal. The frequency-converting mixers 13 include a ground terminal, a first input terminal, a second input terminal, a first output terminal and a second output terminal. In FIG. 1, the ground terminals are not illustrated.

The local signal generation circuit 20 includes a ground terminal, a first output terminal and a second output terminal. Each of the power amplifiers 30 includes a ground terminal, a first input terminal, a second input terminal and an output terminal.

The ground terminal of the local frequency band phase shifter 11 in the phase adjustment circuit 10a is connected to the ground terminals of the local frequency band phase shifters 11 in the respective phase adjustment circuits 10b to 10d, the ground terminals of the buffer amplifiers 12 in the respective phase adjustment circuits 10, the ground terminals of the frequency-converting mixers 13 in the respective phase adjustment circuits 10, the ground terminal of the local signal generation circuit 20, and the ground terminals of the respective power amplifiers 30.

The first input terminal of the local frequency band phase shifter 11 in the phase adjustment circuit 10a is connected to the first input terminals of the local frequency band phase shifters 11 in the respective phase adjustment circuits 10b to 10d, and to the first output terminal of the local signal generation circuit 20. The second input terminal of the local frequency band phase shifter 11 in the phase adjustment circuit 10a is connected to the second input terminals of the local frequency band phase shifters 11 in the respective phase adjustment circuits 10b to 10d, and to the second output terminal of the local signal generation circuit 20.

The first output terminal of the local frequency band phase shifter 11 in the phase adjustment circuit 10a is connected to the first input terminal of the buffer amplifier 12 in the phase adjustment circuit 10a. The second output terminal of the local frequency band phase shifter 11 in the phase adjustment circuit 10a is connected to the second input terminal of the buffer amplifier 12 in the phase adjustment circuit 10a. The first output terminal of the buffer amplifier 12 in the phase adjustment circuit 10a is connected to the first input terminal of the frequency-converting mixer 13 in the phase adjustment circuit 10a. The second output terminal of the buffer amplifier 12 in the phase adjustment circuit 10a is connected to the second input terminal of the frequency-converting mixer 13 in the phase adjustment circuit 10a.

The connections of the local frequency band phase shifters 11, the buffer amplifiers 12 and the frequency-converting mixers 13 in the respective phase adjustment circuits 10b to 10d are similar to the connections of the local frequency band phase shifter 11, the buffer amplifier 12 and the frequency-converting mixer 13 in the phase adjustment circuit 10a. In other words, the first output terminal of the local frequency band phase shifter 11 in the phase adjustment circuit 10b is connected to the first input terminal of the buffer amplifier 12 in the phase adjustment circuit 10b. The second output terminal of the local frequency band phase shifter 11 in the phase adjustment circuit 10b is connected to the second input terminal of the buffer amplifier 12 in the phase adjustment circuit 10b. The first output terminal of the buffer amplifier 12 in the phase adjustment circuit 10b is connected to the first input terminal of the frequency-converting mixer 13 in the phase adjustment circuit 10b. The second output terminal of the buffer amplifier 12 in the phase adjustment circuit 10b is connected to the second input terminal of the frequency-converting mixer 13 in the phase adjustment circuit 10b. Additionally, the first output terminal of the local frequency band phase shifter 11 in the phase adjustment circuit 10c is connected to the first input terminal of the buffer amplifier 12 in the phase adjustment circuit 10c. The second output terminal of the local frequency band phase shifter 11 in the phase adjustment circuit 10c is connected to the second input terminal of the buffer amplifier 12 in the phase adjustment circuit 10c. The first output terminal of the buffer amplifier 12 in the phase adjustment circuit 10c is connected to the first input terminal of the frequency-converting mixer 13 in the phase adjustment circuit 10c. The second output terminal of the buffer amplifier 12 in the phase adjustment circuit 10c is connected to the second input terminal of the frequency-converting mixer 13 in the phase adjustment circuit 10c. Additionally, the first output terminal of the local frequency band phase shifter 11 in the phase adjustment circuit 10d is connected to the first input terminal of the buffer amplifier 12 in the phase adjustment circuit 10d. The second output terminal of the local frequency band phase shifter 11 in the phase adjustment circuit 10d is connected to the second input terminal of the buffer amplifier 12 in the phase adjustment circuit 10d. The first output terminal of the buffer amplifier 12 in the phase adjustment circuit 10d is connected to the first input terminal of the frequency-converting mixer 13 in the phase adjustment circuit 10d. The second output terminal of the buffer amplifier 12 in the phase adjustment circuit 10d is connected to the second input terminal of the frequency-converting mixer 13 in the phase adjustment circuit 10d.

The first output terminal of the frequency-converting mixer 13 in the phase adjustment circuit 10a is connected to the first input terminal of the power amplifier 30a. The second output terminal of the frequency-converting mixer 13 in the phase adjustment circuit 10a is connected to the second input terminal of the power amplifier 30a.

The first output terminal of the frequency-converting mixer 13 in the phase adjustment circuit 10b is connected to the first input terminal of the power amplifier 30b. The second output terminal of the frequency-converting mixer 13 in the phase adjustment circuit 10b is connected to the second input terminal of the power amplifier 30b.

The first output terminal of the frequency-converting mixer 13 in the phase adjustment circuit 10c is connected to the first input terminal of the power amplifier 30c. The second output terminal of the frequency-converting mixer 13 in the phase adjustment circuit 10c is connected to the second input terminal of the power amplifier 30c.

The first output terminal of the frequency-converting mixer 13 in the phase adjustment circuit 10d is connected to the first input terminal of the power amplifier 30d. The second output terminal of the frequency-converting mixer 13 in the phase adjustment circuit 10d is connected to the second input terminal of the power amplifier 30d.

The first IF terminal of the frequency-converting mixer 13 in the phase adjustment circuit 10a is connected to the first IF terminals of the frequency-converting mixers 13 in the respective phase adjustment circuits 10b to 10d. The second IF terminal of the frequency-converting mixer 13 in the phase adjustment circuit 10a is connected to the second IF terminals of the frequency-converting mixers 13 in the respective phase adjustment circuits 10b to 10d.

The output terminal of the power amplifier 30a is connected to the transmission antenna 40a. The output terminal of the power amplifier 30b is connected to the transmission antenna 40b. The output terminal of the power amplifier 30c is connected to the transmission antenna 40c. The output terminal of the power amplifier 30d is connected to the transmission antenna 40d.

Each of the phase adjustment circuits 10 receives a local signal generated by the local signal generation circuit 20. In this case, the local signals generated by the local signal generation circuit 20 are, for example, a first local signal LO1 in which the phase outputted from the first output terminal of the local signal generation circuit 20 serves as reference 0, and a second local signal LO2 in which the phase outputted from the second output terminal of the local signal generation circuit 20 is shifted by 180 degrees from the reference 0.

Each of the phase adjustment circuit 10 adjusts the phase of the local signal received from the local signal generation circuit 20 so that the phase deviation of the transmission signals transmitted from each antenna is a desired phase deviation.

In each of the phase adjustment circuits 10, the ground terminal of the local frequency band phase shifter 11 is connected to the ground terminal of the buffer amplifier 12 and to the ground terminal of the frequency-converting mixer 13. The first input terminal of the local frequency band phase shifter 11 is connected to the first output terminal of the local signal generation circuit 20. The second input terminal of the local frequency band phase shifter 11 is connected to the second output terminal of the local signal generation circuit 20. The first output terminal of the local frequency band phase shifter 11 is connected to the first input terminal of the buffer amplifier 12. The second output terminal of the local frequency band phase shifter 11 is connected to the second input terminal of the buffer amplifier 12. The first output terminal of the buffer amplifier 12 is connected to the first input terminal of the frequency-converting mixer 13. The second output terminal of the buffer amplifier 12 is connected to the second input terminal of the frequency-converting mixer 13.

The first output terminal of the frequency-converting mixer 13 in the phase adjustment circuit 10a is connected to the first input terminal of the power amplifier 30a. The second output terminal of the frequency-converting mixer 13 in the phase adjustment circuit 10a is connected to the second input terminal of the power amplifier 30a. The first output terminal of the frequency-converting mixer 13 in the phase adjustment circuit 10b is connected to the first input terminal of the power amplifier 30b. The second output terminal of the frequency-converting mixer 13 in the phase adjustment circuit 10b is connected to the second input terminal of the power amplifier 30b. The first output terminal of the frequency-converting mixer 13 in the phase adjustment circuit 10c is connected to the first input terminal of the power amplifier 30c. The second output terminal of the frequency-converting mixer 13 in the phase adjustment circuit 10c is connected to the second input terminal of the power amplifier 30c. The first output terminal of the frequency-converting mixer 13 in the phase adjustment circuit 10d is connected to the first input terminal of the power amplifier 30d. The second output terminal of the frequency-converting mixer 13 in the phase adjustment circuit 10d is connected to the second input terminal of the power amplifier 30d. An IF signal corresponding to the phase of the signal input to the first input terminal is input to the first IF terminal of the frequency-converting mixer 13 in each phase adjustment circuit 10. An IF signal corresponding to the phase of the signal input to the second input terminal (in other words, a signal obtained by inverting the signal input to the first input terminal) is input to the second IF terminal of the frequency-converting mixer 13 in each phase adjustment circuit 10.

The local frequency band phase shifter 11 in the phase adjustment circuit 10a receives the first local signal LO1 from the local signal generation circuit 20 via the first input terminal provided in the local frequency band phase shifter 11 itself. The first local signal LO1 is a signal whose phase serves as reference 0. Additionally, the local frequency band phase shifter 11 in the phase adjustment circuit 10a receives the second local signal LO2 from the local signal generation circuit 20 via the second input terminal provided in the local frequency band phase shifter 11 itself. The second local signal LO2 is a signal whose phase is shifted by 180 degrees from the reference phase 0 (in other words, the phase of the first local signal LO1). The local frequency band phase shifter 11 in the phase adjustment circuit 10a, based on the first local signal LO1 and the second local signal LO2, generates four signals, namely, a signal sig0 having the same phase as the reference phase 0, a signal sig90 having a phase that is shifted by 90 degrees from the signal sig0, a signal sig180 having a phase that is shifted by 180 degrees from the signal sig0, and a signal sig270 having a phase that is shifted by 270 degrees from the signal sig0. Furthermore, the local frequency band phase shifter 11 in the phase adjustment circuit 10a, based on the four generated signals, generates a signal sigθ having a phase that is shifted by θ from the reference phase 0, and a signal sig(θ+180) having a phase that is shifted by 180 degrees from the signal sig0.

Figure 2:
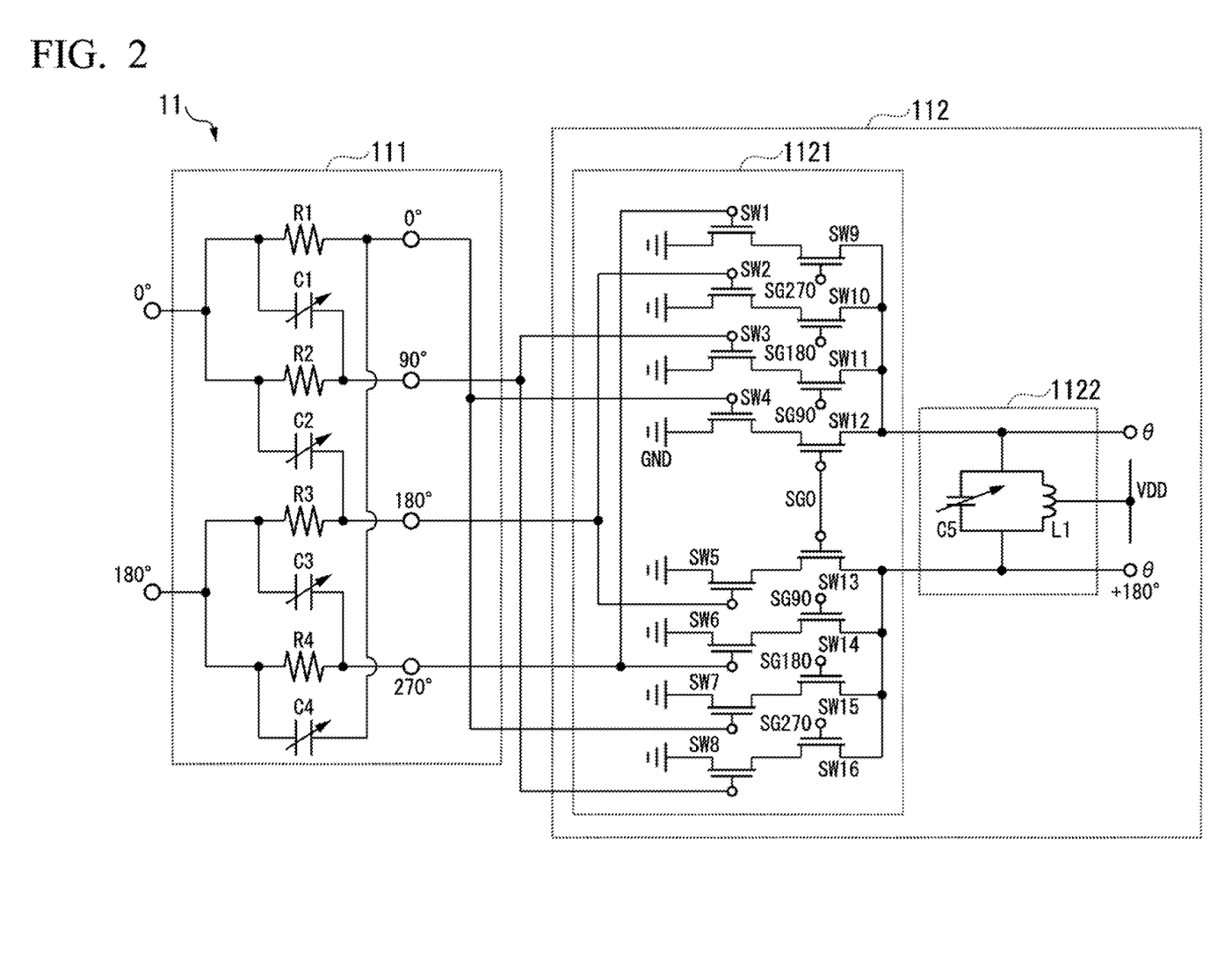
FIG. 2 is a diagram illustrating the structure of a local frequency band phase shifter according to the example embodiment of the present invention.

The local frequency band phase shifters 11, for example, include a quadrature polyphase filter 111 (hereinafter referred to as "quadrature PPF 111") and a phase fine-adjustment circuit 112, as illustrated in FIG. 2.

The quadrature PPF 111 includes resistors R1, R2, R3 and R4, and capacitors C1, C2, C3 and C4. The quadrature PPF 111 is an RC-type PPF, and for example, is a circuit that can output a four-value orthogonal signal with 90-degree steps, having phase values of 0°, 90°, 180° and 270°. The quadrature PPF 111 is able to be formed from lumped-parameter elements without using transmission lines that are highly frequency-dependent, and thus can be installed with a more compact size than a transmission-line impedance characteristic switching filter using technology such as that described in the non-patent document "Yahya Tousi, Alberto Valdes-Garcia, "A Ka-Band Digitally-Controlled Phase Shifter with Sub-Degree Phase Precision", IEEE RFIC, pp. 356-359, 2016." The resistors R1, R2, R3 and R4 and the capacitors C1, C2, C3 and C4 each include a first terminal and a second terminal.

The phase fine-adjustment circuit 112 includes a selector switch circuit 1121 and an LC tank 1122.

The selector switch circuit 1121 includes switches SW1, SW2, SW3, SW4, SW5, SW6, SW7, SW8, SW9, SW10, SW11, SW12, SW13, SW14, SW15 and SW16. The SW1, SW2, SW3, SW4, SW5, SW6, SW7, SW8, SW9, SW10, SW11, SW12, SW13, SW14, SW15 and SW16 each include a first terminal, a second terminal and a control terminal.

The LC tank 1122 includes a capacitor C5 and an inductor L1. The capacitor C5 and the inductor L1 each include a first terminal and a second terminal.

The first terminal of the resistor R1 is connected to the first terminal of the resistor R2, the first terminal of the capacitor C1 and the first terminal of the capacitor C2. The node of the first terminal of the resistor R1 is the same as the node of the first input terminal of the local frequency band phase shifter 11. The second terminal of the resistor R1 is connected to the first terminal of the capacitor C4, the control terminal of the switch SW4 and the control terminal of the switch SW7.

The second terminal of the resistor R2 is connected to the second terminal of the capacitor C1, the control terminal of the switch SW3 and the control terminal of the switch SW8.

The first terminal of the resistor R3 is connected to the first terminal of the resistor R4, the first terminal of the capacitor C3 and the second terminal of the capacitor C4. The node of the first terminal of the resistor R3 is the same as the node of the second input terminal of the local frequency band phase shifter 11. The second terminal of the resistor R3 is connected to the second terminal of the capacitor C2, the control terminal of the switch SW2 and the control terminal of the switch SW6.

The second terminal of the resistor R4 is connected to the second terminal of the capacitor C3, the control terminal of the switch SW1 and the control terminal of the switch SW5.

The first terminal of the switch SW1 is connected to the first terminals of the respective switches SW2, SW3, SW4, SW5, SW6, SW7 and SW8. The node of the first terminal of the switch SW1 is the same as the node of the ground terminal. The second terminal of the switch SW1 is connected to the first terminal of the switch SW9.

The second terminal of the switch SW2 is connected to the first terminal of the switch SW10. The second terminal of the switch SW3 is connected to the first terminal of the switch SW11. The second terminal of the switch SW4 is connected to the first terminal of the switch SW12. The second terminal of the switch SW5 is connected to the first terminal of the switch SW13. The second terminal of the switch SW6 is connected to the first terminal of the switch SW14. The second terminal of the switch SW7 is connected to the first terminal of the switch SW15. The second terminal of the switch SW8 is connected to the first terminal of the switch SW16.

The second terminal of the switch SW9 is connected to the second terminals of the respective switches SW10, SW11 and SW12, the first terminal of the capacitor C5 and the first terminal of the inductor L1. The node of the second terminal of the switch SW9 is the same as the node of the first output terminal of the local frequency band phase shifter 11.

The second terminal of the switch SW13 is connected to the second terminals of the respective switches SW14, SW15 and SW16, the second terminal of the capacitor C5 and the second terminal of the inductor L1. The node of the second terminal of the switch SW13 is the same as the node of the second output terminal of the local frequency band phase shifter 11.

A voltage input terminal for supplying power is provided at an intermediate point between the first terminal and the second terminal of the inductor L1, and a voltage VDD is applied to this voltage input terminal.

The signal SG0 is applied to the switches SW12 and SW13. The signal SG0 is a signal that causes the switches SW12 and SW13 to be the on state or the off state.

The signal SG90 is applied to the switches SW11 and SW14. The signal SG90 is a signal that causes the switches SW11 and SW14 to be the on state or the off state.

The signal SG180 is applied to the switches SW10 and SW15. The signal SG180 is a signal that causes the switches SW10 and SW15 to be the on state or the off state.

The signal SG270 is applied to the switches SW9 and SW16. The signal SG270 is a signal that causes the switches SW9 and SW16 to be the on state or the off state.

One of the four signals SG0, SG90, SG180 and SG270 is a signal that causes a switch to be the on state, and the other signals are signals that causes switches to be the off state.

Therefore, the local frequency band phase shifter 11 illustrated in FIG. 2 is able to finely adjust the phase of the signal output from the quadrature PPF 111 by changing the capacitance values of the capacitors C1, C2, C3 and C4, and by causing any of the switches SW12 and SW13, the switches SW11 and SW14, the switches SW10 and SW15, or the switches SW9 and SW16 in the on and off switch 113 to be the on state, the four orthogonal signals generated by the quadrature PPF 111 are selected so as to form differential signals having a phase difference of 180 degrees. Specifically, when the phase shift is adjusted such that the phase difference between the input and output signals of the local frequency band phase shifter 11 is within a range from 0 degrees up to but not including 90 degrees, the switches SW12 and SW13 are set to be the on state, and the other switches are set to be the off state. Additionally, when the phase shift is adjusted such that the phase difference between the input and output signals of the local frequency band phase shifter 11 is within a range from 90 degrees up to but not including 180 degrees, the switches SW11 and SW14 are set to be the on state, and the other switches are set to be the off state. Additionally, when the phase shift is adjusted such that the phase difference between the input and output signals of the local frequency band phase shifter 11 is within a range from 180 degrees up to but not including 270 degrees, the switches SW10 and SW15 are set to be the on state, and the other switches are set to be the off state. Additionally, when the phase shift is adjust such that the phase difference between the input and output signals of the local frequency band phase shifter 11 is within a range from 270 degrees up to but not including 360 degrees, the switches SW9 and SW16 are set to be the on state, and the other switches are set to be the off state. In this case, among the transistors constituting the switches, a fixed direct current voltage greater than or equal to the transistor threshold value is applied to the transistors that are to be the on state, and a fixed direct current voltage less than the transistor threshold value is applied to the transistors that are to be the off state. Additionally, for example, when the radiation direction of an output signal from the array antenna device 1 is changed, for the phase adjustment circuit 10a connected to each antenna 4, the on/off states of the switches SW9 to SW16 and the capacitance value of the capacitor C5 in the LC tank 1122 are adjusted so as to set the respective phase shift states to form the desired beam pattern.

By changing the capacitance value of the capacitor C5 constituting the LC tank 1122, the differential signals selected by the local frequency band phase shifter 11 as described above can be adjusted such that the phase difference of 0 to 90 degrees is further added, while maintaining the 180-degree phase difference of the differential signals output from the quadrature PPF 111, allowing the phase shift to be adjusted within the above-mentioned phase shift range from 0 degrees up to but not including 360 degrees.

When the capacitance values of the capacitors C1 to C5 are to be changed, for example, in the case in which the capacitors C1 to C5 are each composed of a plurality of parallel-connected capacitors, the capacitance values are changed by switching the numbers of parallel-connected capacitors, and in the case in which the capacitors C1 to C5 are each capacitors in which the capacitance value is changed by means of the applied voltage, the capacitance values are changed by adjusting the applied voltages.

The buffer amplifier 12 in the phase adjustment circuit 10a receives power from the local frequency band phase shifter 11 in the phase adjustment circuit 10a. The buffer amplifier 12 in the phase adjustment circuit 10a amplifies the received power up to an input power in which the input-output power characteristic of power of the frequency-converting mixer 13 in the phase adjustment circuit 10a is out of the linear region (for example, an input power that is at least the 1-dB gain compression point (P1 dB) of the frequency-converting mixer 13 or higher), and inputs the amplified power to the frequency-converting mixer 13 of the phase adjustment circuit 10a.

Figure 3:
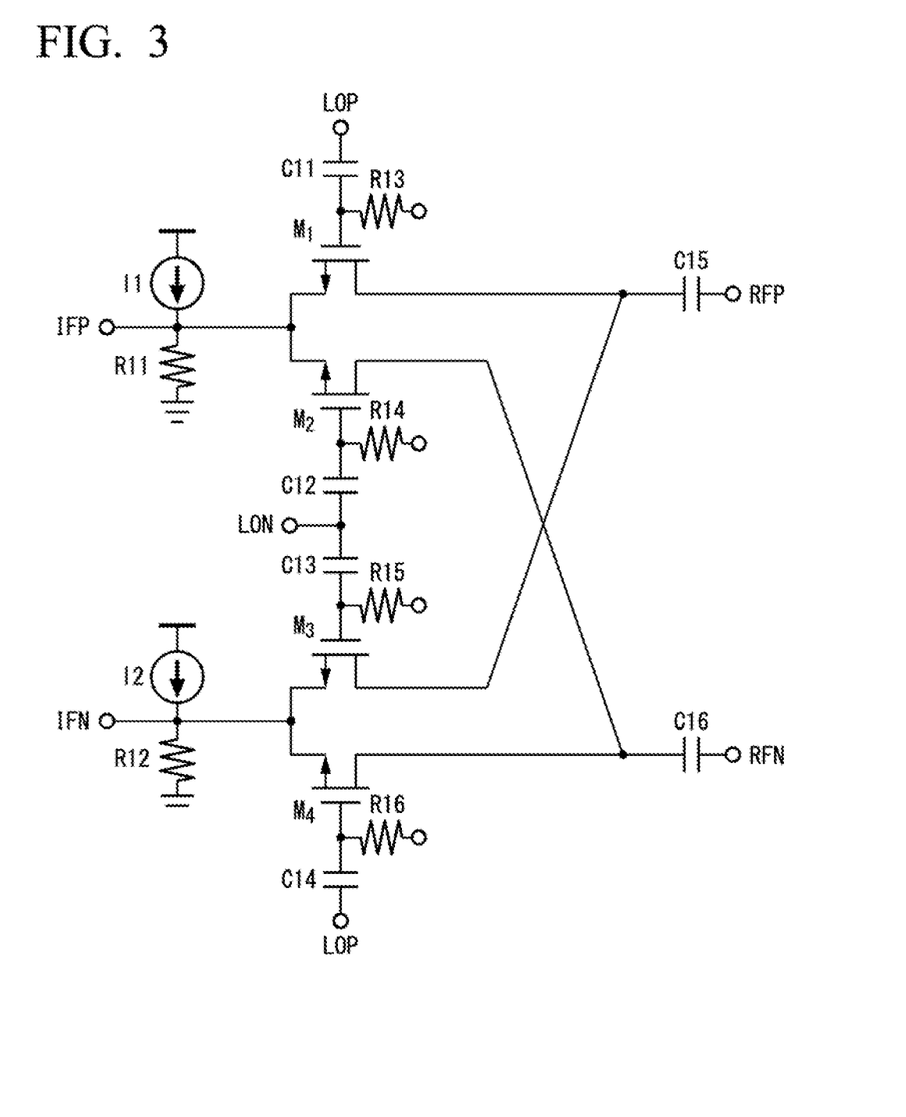
FIG. 3 is a diagram illustrating the structure of a frequency-converting mixer according to the example embodiment of the present invention.

The frequency-converting mixer 13 in the phase adjustment circuit 10a mixes the amplified power output from the first output terminal of the buffer amplifier 12 with the first IF signal, and generates a first RF signal. The frequency-converting mixer 13 in the phase adjustment circuit 10a mixes the amplified power output from the second output terminal of the buffer amplifier 12 with the second IF signal, and generates a second RF signal. The frequency-converting mixer 13 is, for example, a double-balanced mixer as illustrated in FIG. 3. The frequency-converting mixer 13 includes nMOS transistors M1, M2, M3 and M4, resistors R11, R12, R13, R14, R15 and R16, capacitors C11, C12, C13, C14, C15 and C16, and constant-current sources I1 and I2, as illustrated in FIG. 3.

Each of the nMOS transistors M1, M2, M3 and M4 includes a gate terminal, a drain terminal and a source terminal.

The resistors R11, R12, R13, R14, R15 and R16, the capacitors C11, C12, C13, C14, C15 and C16, and the constant-current sources I1 and I2 each include a first terminal and a second terminal.

The gate terminal of the nMOS transistor M1 is connected to the first terminal of the resistor 13 and the first terminal of the capacitor C11. The drain terminal of the nMOS transistor M1 is connected to the drain terminal of the nMOS transistor M3 and the first terminal of the capacitor C15. The source terminal of the nMOS transistor M1 is connected to the source terminal of the nMOS transistor M2, the first terminal of the resistor 11 and the first terminal of the constant-current source I1. An IF signal having a phase corresponding to the phase of the signal output from the first output terminal of the local frequency band phase shifter 11 is input to the source terminal of the nMOS transistor M1.

The gate terminal of the nMOS transistor M2 is connected to the first terminal of the resistor R14 and the first terminal of the capacitor C12. The drain terminal of the nMOS transistor M2 is connected to the drain terminal of the nMOS transistor M4 and the first terminal of the capacitor C16.

The gate terminal of the nMOS transistor M3 is connected to the first terminal of the resistor R15 and the first terminal of the capacitor C13. The source terminal of the nMOS transistor M3 is connected to the source terminal of the nMOS transistor M4, the first terminal of the resistor R12 and the first terminal of the constant-current source I2.

An IF signal having a phase corresponding to the phase of the signal output from the second output terminal of the local frequency band phase shifter 11 (in other words, a signal obtained by inverting the IF signal input to the source terminal of the nMOS transistor M1) is input to the source terminal of the nMOS transistor M3.

The gate terminal of the nMOS transistor M4 is connected to the first terminal of the resistor R16 and the first terminal of the capacitor C14.

The second terminal of the resistor R11 is connected to the second terminal of the resistor R12. The node of the second terminal of the resistor R11 is the same as the node of the ground terminal.

A bias voltage for determining the direct current bias of the gate terminal of the nMOS transistor M1 is applied to the second terminal of the resistor R13. A bias voltage for determining the direct current bias of the gate terminal of the nMOS transistor M2 is applied to the second terminal of the resistor R14. A bias voltage for determining the direct current bias of the gate terminal of the nMOS transistor M3 is applied to the second terminal of the resistor R15. A bias voltage for determining the direct current bias of the gate terminal of the nMOS transistor M4 is applied to the second terminal of the resistor R16.

The second terminal of the capacitor C11 is connected to the second terminal of the capacitor C14. The signal output from the first output terminal of the local frequency band phase shifter 11 is input to the second terminal of the capacitor C11.

The second terminal of the capacitor C12 is connected to the second terminal of the capacitor C13. The signal output from the second output terminal of the local frequency band phase shifter 11 (in other words, a signal obtained by inverting the signal output from the first output terminal of the local frequency band phase shifter 11) is input to the second terminal of the capacitor C12.

The second terminal of the constant-current source I1 is connected to the second terminal of the constant-current source I2. A power source is applied to the second terminal of the constant-current source I1.

A first RF signal having a phase corresponding to the phase of the signal output from the first output terminal of the local frequency band phase shifter 11 is output from the second terminal of the capacitor C15.

A second RF signal having a phase corresponding to the phase of the signal output from the second output terminal of the local frequency band phase shifter 11 (in other words, a signal obtained by inverting the RF signal output from the second terminal of the capacitor C15) is output from the second terminal of the capacitor C16.

The frequency-converting mixer 13 illustrated in FIG. 3 mixes the IF signal input to the source terminal of the nMOS transistor M1 with the signal input to the second terminal of the capacitor C11, and outputs, from the second terminal of the capacitor C15, an RF signal having a phase corresponding to the phase of the mixed signal.

The frequency-converting mixer 13 illustrated in FIG. 3 mixes the IF signal input to the source terminal of the nMOS transistor M4 with a signal input to the second terminal of the capacitor C14, and outputs, from the second terminal of the capacitor C16, an RF signal having a phase corresponding to the phase of the mixed signal.

The power amplifier 30a receives the signals output from the frequency-converting mixer 13 in the phase adjustment circuit 10a as differential inputs, amplifies the received signals and transmits an RF signal from the antenna 40a.

The signal path composed of the phase adjustment circuit 10b, the power amplifier 30b and the antenna 40b, the signal path composed of the phase adjustment circuit 10c, the power amplifier 30c and the antenna 40c, and the signal path composed of the phase adjustment circuit 10d, the power amplifier 30d and the antenna 40d can each be considered to be similar to the signal path composed of the phase adjustment circuit 10a, the power amplifier 30a and the antenna 40a, such that the phase and amplitude of signals can be adjusted independently in each signal path.

Examples

The phase adjustment circuit 10 including the local frequency band phase shifter 11, the buffer amplifier 12 and the frequency-converting mixer 13 was simulated.

Figure 4:
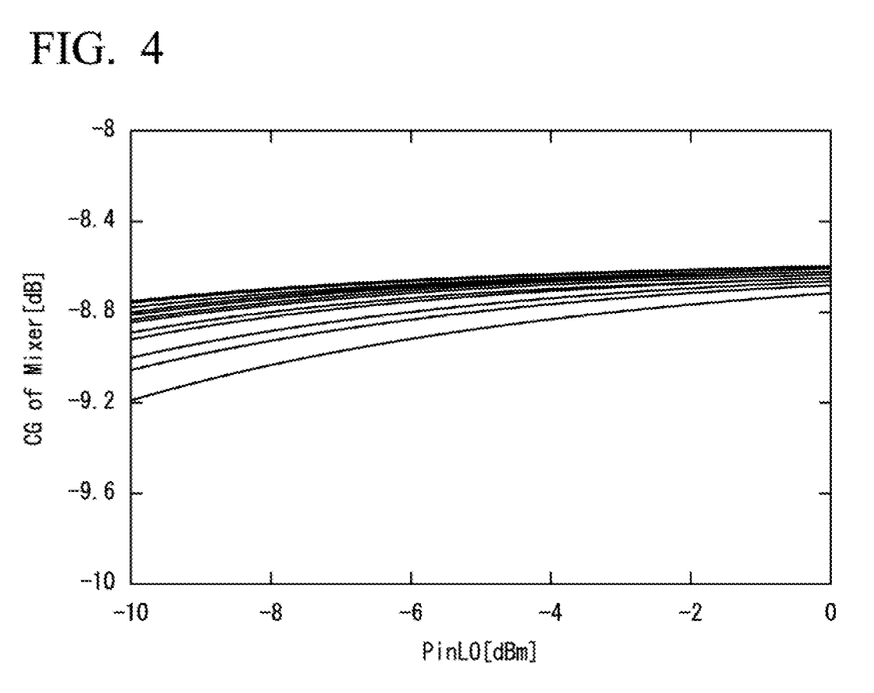
FIG. 4 is a diagram illustrating the relationship between the input power input to a local frequency band phase shifter and the power conversion gain in a frequency-converting mixer according to the example embodiment of the present invention.

FIG. 4 is a diagram showing the relationship between the input power that is input to the local frequency band phase shifter 11 and the power conversion gain in the frequency-converting mixer 13.

In FIG. 4, the horizontal axis indicates the input power that is input to the local frequency band phase shifter 11. The vertical axis indicates the power conversion gain in the frequency-converting mixer 13. The power conversion gain in the frequency-converting mixer 13 is computed by dividing the output power of the frequency-converting mixer 13 by the input power. In FIG. 4, the relationship between the input power and the power conversion gain is indicated by fifteen curves. Each curve corresponds to one of the fifteen values from 0000 to 1111 represented by four bits indicated by the four orthogonal signals. The correspondence between the fifteen curves and the four-bit values indicated by the four orthogonal signals is such that, in the descending order of the magnitude of the power conversion gain in the frequency-converting mixer 13, i.e., in the descending order of the magnitude of the output power from the frequency-converting mixer 13, the curves correspond to the four-bit values 0101, 1000, 0011, 0111, 1010, 0001, 0100, 1100, 1001, 0010, 1110, 1011, 0000, 1101 and 1111 indicated by the four orthogonal signals.

As can be understood from FIG. 4, when the input power input to the local frequency band phase shifter 11 is small, there is a large variance in the power conversion gain in the frequency-converting mixer 13, i.e., in the value of the output power from the frequency-converting mixer 13, depending on the four-bit value indicated by the four orthogonal signals. For this reason, in order to suppress variation in the values of the output power from the frequency-converting mixer 13, in the phase adjustment circuit 10 according to the example embodiment of the present invention, the buffer amplifier 12 is provided in front of the frequency-converting mixer 13, and the input power to the frequency-converting mixer 13 is amplified to at least the 1-dB gain compression point (P1 dB) or higher, preferably until the output power is saturated.

Additionally, the local frequency band phase shifter 11 adjusts the overall phase including the influence on the phase due to the buffer amplifier 12.

The buffer amplifier 12 according to the example embodiment of the present invention may have a fixed gain or a variable gain as long as it performs amplification up to the input power in which the input-output characteristic of the power of the frequency-converting mixer 13 in the phase adjustment circuit 10 is out of the linear region (for example, an input power that is at least the 1-dB gain compression point (P1 dB) of the frequency-converting mixer 13 or higher). However, when the buffer amplifier 12 according to the example embodiment of the present invention is a variable-gain, the output power can be set to a desired value with higher precision than that in the case of a fixed-gain, and the signals output by the array antenna device 1 can be adjusted, such as by allowing the signals output by the array antenna device 1 to be transmitted, for example, in a direction that is more accurate than before.

Thus, the buffer amplifier 12 in each of the phase adjustment circuits 10 amplifies the power received from the local frequency band phase shifter 11 up to an input power in which the input-output power characteristic of power of the frequency-converting mixer 13 in the phase adjustment circuit 10 is out of the linear region (for example, an input power that is at least the 1-dB gain compression point (P1 dB) of the frequency-converting mixer 13 or higher). For this reason, the output power output by the frequency-converting mixer 13 can be made substantially constant. Additionally, the phase can be adjusted by means of the local frequency band phase shifter 11.

Therefore, the phase adjustment circuit 10 according to the example embodiment of the present invention is able to adjust the amplitude and the phase of the output power from the frequency-converting mixer 13 to be a desired amplitude and phase. As a result thereof, the array antenna device 1 is able to adjust the amplitude and phase of the signal output by each antenna with higher precision, and can form a beam pattern generated by combining the signals output by each of the antennas so as to obtain a desired beam pattern.

Next, a minimum-structure phase adjustment circuit 10 according to an example embodiment of the present invention will be explained.

Figure 5:
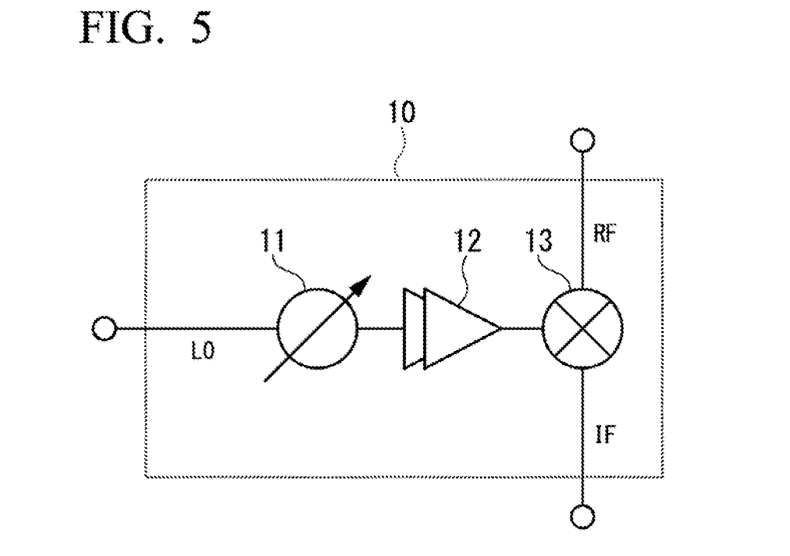
FIG. 5 is a diagram illustrating a minimum structure of a phase adjustment circuit according to an example embodiment of the present invention.
Figure 6:
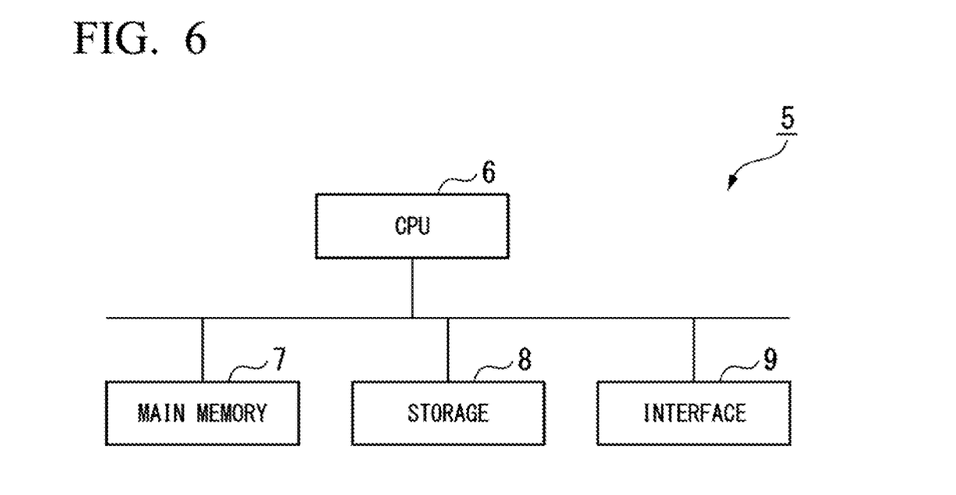
FIG. 6 is a schematic block diagram illustrating the structure of a computer according to at least one example embodiment.

The minimum-structure phase adjustment circuit 10 according to the example embodiment of the present invention includes a local frequency band phase shifter 11, a buffer amplifier 12 and a frequency-converting mixer 13, as illustrated in FIG. 5.

The local frequency band phase shifter 11 adjusts the phase of a signal in a local signal frequency band and outputs the adjusted signal to the buffer amplifier 12.

The frequency-converting mixer 13 receives the adjusted signal and a signal other than the adjusted signal, and mixes the adjusted signal with the other signal.

The buffer amplifier 12 is an amplifier that is provided between the local frequency band phase shifter 11 and the frequency-converting mixer 13, and that is capable of amplifying an input power that is to be input to the frequency-converting mixer 13 so that the input power is up to be in an input power range in which an input-output characteristic of power of the frequency-converting mixer 13 is out of a linear region.

By doing so, in the phase adjustment circuit 10, it is possible to obtain the respective desired phases while also reducing the output power difference (amplitude difference) between the phases. In other words, the amplitude deviation and the phase deviation in the phase adjustment circuit 10 can be adjusted with high precision.

In general, when the input power to a phase shifter is strong, the non-linear characteristics of the input-output power become stronger (in the switches SW1 to SW16 and the capacitors C1 to C5 in the example embodiment of the present invention), the signal becomes distorted and the desired functions are not obtained. For this reason, in the phase adjustment circuit 10 according to the example embodiment of the present invention, the buffer amplifier 12 is preferably provided between the local frequency band phase shifter 11 and the frequency-converting mixer 13.

Additionally, in general, loss occurs in phase shifters, thus often lowering the signal strength. For this reason, in order to amplify the output power from the frequency-converting mixer 13 to the saturation region level, in the phase adjustment circuit 10 in an example embodiment of the present example embodiment, it is desirable for the buffer amplifier 12 to be provided between the local frequency band phase shifter 11 and the frequency-converting mixer 13.

Additionally, when the buffer amplifier 12 is provided so as to follow the frequency-converting mixer 13, the frequency band that is to be handled by the buffer amplifier 12 is an RF frequency band. In other words, the buffer amplifier 12 serves as an amplifier in the RF frequency band. This RF frequency band is determined by both the frequency band of the local signals and the IF frequency band. By providing the buffer amplifier 12 between the local frequency band phase shifter 11 and the frequency-converting mixer 13, such as in the buffer amplifier 12 in the phase adjustment circuit 10 in the example embodiment of the present invention, it is sufficient to make corrections to just one frequency among the local signal, making it possible to easily reduce, with high precision, the amplitude deviation between phase values.

Regarding the processes in the example embodiments of the present invention, the order of the processes may be changed within a range such that appropriate processes are performed.

The storage unit and other storage devices in the example embodiment of the present invention may each be provided anywhere within a range such that information can be appropriately exchanged. Additionally, the storage unit and other storage devices may each be provided in multiple parts in which the data is distributed, within a range such that information can be appropriately exchanged.

While explained with regard to the example embodiments of the present invention, the above-mentioned phase adjustment circuit, array antenna device and other control devices may have computer systems therein. Furthermore, the steps in the above-mentioned processes are stored in computer-readable storage media in the form of programs, and the above-mentioned processes are performed by a computer reading and running these programs. A specific example of a computer is indicated below.

FIG. 7 is a schematic block diagram illustrating the structure of a computer according to at least one example embodiment.

As illustrated in FIG. 7, the computer 5 includes a CPU 6, a main memory 7, a storage 8 and an interface 9.

For example, the above-mentioned phase adjustment circuit, array antenna device and other control devices are each mounted on the computer 5. Furthermore, the actions of the above-mentioned processing units are stored, in the form of programs, in the storage 8. The CPU 6 reads the programs from the storage 8, loads them in the main memory 7, and runs the above-mentioned processes in accordance with said programs. Additionally, in accordance with the programs, the CPU 6 secures, in the main memory 7, a storage area corresponding to each of the above-mentioned storage units.

Examples of the storage 8 include HDDs (Hard Disk Drives), SSDs (Solid-State Drives), magnetic disks, magneto-optic disks, CD-ROMS (Compact Disc Read-Only Memory), DVD-ROMs (Digital Versatile Disc Read-Only Memory), semiconductor memory and the like. The storage 8 may be internal media that is directly connected to a bus in the computer 5, or may be external media that is connected to the computer 5 via an interface 9 or a communication line. Additionally, if this program is to be distributed to the computer 5 by means of a communication line, then the computer 5 to which the program has been distributed may load said program in the main memory 7 and execute the above-mentioned processes. In at least one example embodiment, the storage 8 is a non-temporary, tangible storage medium.

Additionally, the above-mentioned program may be used to realize some of the aforementioned functions. Furthermore, the above-mentioned program may be a file, i.e., a so-called difference file (difference program), that can be realized by combining the aforementioned functions with a program that is already recorded in the computer system.

While some example embodiments of the present invention have been explained, these example embodiments are examples and do not limit the scope of the invention. These example embodiments may undergo various additions, omissions, replacements and modifications within a range not departing from the spirit of the invention.

Some or all of the above-mentioned example embodiments may be described as indicated in the following appendices, but the invention is not limited to the following.

(Supplementary Note 1)

A phase adjustment circuit comprising:

a local frequency band phase shifter that adjusts a phase of a signal in a local signal frequency band and that outputs the adjusted signal;

a frequency-converting mixer that receives the adjusted signal and another signal different from the adjusted signal, and that mixes the adjusted signal with the other signal; and a buffer amplifier that is provided between the local frequency band phase shifter and the frequency-converting mixer, and that is capable of amplifying an input power that is to be input to the frequency-converting mixer so that the input power is up to be in an input power range in which an input-output characteristic of power of the frequency-converting mixer is out of a linear region.

(Supplementary Note 2)

The phase adjustment circuit according to supplementary note 1, wherein:

the input power range in which the input-output characteristic of power of the frequency-converting mixer is out of the linear region is an input power range that is at least a 1-dB gain compression point of the frequency-converting mixer or higher; and the buffer amplifier is capable of amplifying the input power so that the input power is up to be in the input power range that is at least the 1-dB gain compression point of the frequency-converting mixer or higher.

(Supplementary Note 3)

The phase adjustment circuit according to supplementary note 1 or 2, wherein:

the input power range in which the input-output characteristic of power of the frequency-converting mixer is out of the linear region is an input power range in which an output power of the frequency-converting mixer becomes saturated; and the buffer amplifier is capable of amplifying the input power so that the input power is up to be in the input power range in which the output power of the frequency-converting mixer becomes saturated.

(Supplementary Note 4)

The phase adjustment circuit according to any one of supplementary notes 1 to 3, wherein the local frequency band phase shifter comprises:

a four-value orthogonal signal generation circuit that generates a four-value orthogonal signal with 90-degree steps; and an LC tank that follows the four-value orthogonal signal generation circuit, and that includes a capacitor including a variable capacitance value.

(Supplementary Note 5)

The phase adjustment circuit according to supplementary note 4, wherein the four-value orthogonal signal generation circuit comprises an RC-type polyphase filter.

(Supplementary Note 6)

The phase adjustment circuit according to any one of supplementary notes 1 to 5, wherein the buffer amplifier outputs a saturated power of the frequency-converting mixer irrespective of a phase value setting of the local frequency band phase shifter.

(Supplementary Note 7)

The phase adjustment circuit according to any one of supplementary notes 1 to 6, wherein the buffer amplifier is a variable-gain amplifier.

(Supplementary Note 8)

The phase adjustment circuit according to any one of supplementary notes 1 to 7, wherein the buffer amplifier controls a magnitude of an output power by adjusting a gain.

(Supplementary Note 9)

An array antenna device comprising phase adjustment circuits according to any one of supplementary notes 1 to 8, and antennas that transmit an output power that is output from the phase adjustment circuits.

(Supplementary Note 10)

The array antenna according to supplementary note 9, wherein each of the phase adjustment circuits adjusts an amplitude and a phase of a signal in the circuit itself, thereby changing a magnitude and a phase of the output power output by each of the antennas, and changing a beam pattern generated by combining the output powers.

(Supplementary Note 11)

A control method comprising:
adjusting a phase of a signal in a local signal frequency band and outputting the adjusted signal;
receiving the adjusted signal and another signal different from the adjusted signal and mixing the adjusted signal with the other signal; and
amplifying an input power that is to be input to a frequency-converting mixer so that the input power is up to be in an input power range in which an input-output characteristic of power of the frequency-converting mixer is out of a linear region.

(Supplementary Note 12)

A program that causes a computer to execute:
adjusting a phase of a signal in a local signal frequency band and outputting the adjusted signal;
receiving the adjusted signal and another signal different from the adjusted signal and mixing the adjusted signal with the other signal; and
amplifying an input power that is to be input to a frequency-converting mixer so that the input power is up to be in an input power range in which an input-output characteristic of power of the frequency-converting mixer is out of a linear region.

INDUSTRIAL APPLICABILITY

The present invention may be applied to a phase adjustment circuit and an array antenna device.

REFERENCE SYMBOLS

1 Array antenna device
5 Computer
6 CPU
7 Main memory
8 Storage
9 Interface
10, 10a-10d Phase adjustment circuit
11 Local frequency band phase shifter
12 Buffer amplifier
13 Frequency-converting mixer
20 Local signal generation circuit
30, 30a-30d Power amplifier
40, 40a-40d Antenna
111 Quadrature polyphase filter
112 Phase fine-adjustment circuit
1121 Selector switch circuit
1122 LC tank
R1-R16 Resistor
C1-C16 Capacitor
M1-M4 nMOS transistor
I1, I2 Constant-current source

The invention claimed is:

1. A phase adjustment circuit comprising:
a local frequency band phase shifter that adjusts a phase of a signal in a local signal frequency band and that outputs the adjusted signal;
a frequency-converting mixer that receives the adjusted signal and another signal different from the adjusted signal, and that mixes the adjusted signal with the other signal; and a buffer amplifier that is provided between the local frequency band phase shifter and the frequency-converting mixer, and that is capable of amplifying an input power that is to be input to the frequency-converting mixer so that the input power is up to be in an input power range in which an input-output characteristic of power of the frequency-converting mixer is out of a linear region,
wherein:
the input power range in which the input-output characteristic of power of the frequency-converting mixer is out of the linear region is an input power range that is at least a 1-dB gain compression point of the frequency-converting mixer or higher; and
the buffer amplifier is capable of amplifying the input power so that the input power is up to be in the input power range that is at least the 1-dB gain compression point of the frequency-converting mixer or higher.

2. The phase adjustment circuit according to claim 1, wherein:
the input power range in which the input-output characteristic of power of the frequency-converting mixer is out of the linear region is an input power range in which an output power of the frequency-converting mixer becomes saturated; and
the buffer amplifier is capable of amplifying the input power so that the input power is up to be in the input power range in which the output power of the frequency-converting mixer becomes saturated.

3. The phase adjustment circuit according to claim 1, wherein
the local frequency band phase shifter comprises:
a four-value orthogonal signal generation circuit that generates a four-value orthogonal signal with 90-degree steps; and
an LC tank that follows the four-value orthogonal signal generation circuit, and that includes a capacitor including a variable capacitance value.

4. The phase adjustment circuit according to claim 3, wherein the four-value orthogonal signal generation circuit comprises an RC-type polyphase filter.

5. The phase adjustment circuit according to claim 1, wherein the buffer amplifier outputs a saturated power of the frequency-converting mixer irrespective of a phase value setting of the local frequency band phase shifter.

6. The phase adjustment circuit according to claim 1, wherein the buffer amplifier is a variable-gain amplifier.

7. The phase adjustment circuit according to claim 1, wherein the buffer amplifier controls a magnitude of an output power by adjusting a gain.

8. An array antenna device comprising phase adjustment circuits according to claim 1, and antennas that transmit an output power that is output from the phase adjustment circuits.

9. The array antenna according to claim 8, wherein each of the phase adjustment circuits adjusts an amplitude and a phase of a signal in the circuit itself, thereby changing a magnitude and a phase of the output power output by each of the antennas, and changing a beam pattern generated by combining the output powers.

10. A control method comprising:
- adjusting a phase of a signal in a local signal frequency band and outputting the adjusted signal;
- receiving the adjusted signal and another signal different from the adjusted signal and mixing the adjusted signal with the other signal; and
- amplifying an input power that is to be input to a frequency-converting mixer so that the input power is up to be in an input power range in which an input-output characteristic of power of the frequency-converting mixer is out of a linear region, wherein:
- the input power range in which the input-output characteristic of power of the frequency-converting mixer is out of the linear region is an input power range that is at least a 1-dB gain compression point of the frequency-converting mixer or higher; and
- amplifying the input power so that the input power is up to be in the input power range that is at least the 1-dB gain compression point of the frequency-converting mixer or higher.

11. A non-transitory computer-readable recording medium storing a program that causes a computer to execute:
- adjusting a phase of a signal in a local signal frequency band and outputting the adjusted signal;
- receiving the adjusted signal and another signal different from the adjusted signal and mixing the adjusted signal with the other signal; and
- amplifying an input power that is to be input to a frequency-converting mixer so that the input power is up to be in an input power range in which an input-output characteristic of power of the frequency-converting mixer is out of a linear region, wherein:
- the input power range in which the input-output characteristic of power of the frequency-converting mixer is out of the linear region is an input power range that is at least a 1-dB gain compression point of the frequency-converting mixer or higher; and
- amplifying the input power so that the input power is up to be in the input power range that is at least the 1-dB gain compression point of the frequency-converting mixer or higher.

* * * * *